United States Patent [19]

Faure et al.

[11] Patent Number: 5,600,883
[45] Date of Patent: Feb. 11, 1997

[54] METHOD OF TIP FORMATION FOR SPRING PROBE WITH PILOTED AND HEADED CONTACT

[75] Inventors: Louis H. Faure, Poughkeepsie; Terence W. Spoor, Marlboro, both of N.Y.

[73] Assignee: International Business Machines Corporation, Armonk, N.Y.

[21] Appl. No.: 461,899

[22] Filed: Jun. 5, 1995

Related U.S. Application Data

[62] Division of Ser. No. 175,336, Dec. 29, 1993, which is a division of Ser. No. 922,588, Jul. 30, 1992, abandoned.

[51] Int. Cl.$^6$ ................................................. H01R 43/00
[52] U.S. Cl. ........................ 29/846; 29/825; 324/761; 439/66
[58] Field of Search ....................... 439/66; 29/832, 29/846, 825; 324/761

[56] References Cited

U.S. PATENT DOCUMENTS

| | | | |
|---|---|---|---|
| 4,029,375 | 6/1977 | Gabrielian | 439/66 |
| 4,357,062 | 11/1982 | Everett | 29/832 X |
| 4,443,756 | 4/1984 | Lightbody et al. | |
| 4,508,405 | 4/1985 | Damon et al. | 439/66 X |
| 4,528,500 | 7/1985 | Lightbody et al. | 439/66 X |
| 5,092,774 | 3/1992 | Milan | 439/66 |
| 5,388,997 | 2/1995 | Grange et al. | 439/66 |
| 5,388,998 | 2/1995 | Grange et al. | 439/66 |

*Primary Examiner*—Carl J. Arbes
*Attorney, Agent, or Firm*—Graham S. Jones, II

[57] ABSTRACT

Testing probes in a testing apparatus are supported in a unitary structure to provide rigidity of the supports for the probes in testing. The spring probes have a contact head at the distal end from the probe tip with a set of antirotation tabs which lock in a cooperating antirotation slot in the probe guide. The contact head has a cone-shaped pilot at its tip which is engaged with a gold-plated contact spring. The inner diameter is integrally in contact with the pilot by mechanical engagement or bonding by soldering or laser welding or the like. A method of forming a probe tip on an array of test probes in a support member of a test apparatus includes inserting a plurality of probes into an array of probe cylinders in the member with the ends of the probes extending below the ends of the cylinders, the probes being retained by fixturing means at a predetermined position in the cylinders, the ends of the probes are planarized to provide a smooth surface of the member with the probes flush therewith, apply a layer of resist to the lower surface of the member covering the guide plate and the newly planarized lower ends of the probes, after the resist has been exposed to a pattern through a high precision mask, a set of rings at the base of the planarized probes is formed in the resist by etching the tips through the resist, and then remove the fixturing means.

8 Claims, 3 Drawing Sheets

METHOD OF TIP FORMATION FOR SPRING PROBE WITH PILOTED AND HEADED CONTACT

This application is a division of application Ser. No. 08/175,336 filed on Dec. 29, 1993 (pending) which is a division of application Ser. No. 07/922,588, filed Jul. 30, 1992 (abandoned).

BACKGROUND OF THE INVENTION

1. Field of the Invention

This invention relates to probes for testing electrical devices and more particularly to testing of microelectronic devices.

2. Description of related art

Testing of circuits by means of spring probes is a highly developed technology. However, as the technology changes with ever decreasing dimensions of the devices being tested, problems arise.

Now there are a number of problems with the technology for testing of circuits among which are as follows:

1. Currently available spring probes are retained in holders which rotate in the guides causing damage to product pads.
2. Contact integrity between the probes and the contact springs is poor.
3. Probe-to-probe locations must be more accurate in current technical environment, in order to be able to contact the very accurate dense arrays of miniature product test pads.
4. By design, state-of-the art spring plunger probes are contained in sleeves which increase the diameter of the package. This negates their use in applications where test features have very close center-to-center distances.

In accordance with this invention, several features are provided, as follows:

Testing probes in a testing apparatus are supported in a unitary structure to provide rigidity of the supports for the probes in testing.

The spring probes have a contact head at the distal end from the probe tip with a set of antirotation tabs which lock in a cooperating antirotation slot in the probe guide. The contact head has a cone-shaped pilot at its tip which is engaged with a gold-plated contact spring. The inner diameter As integrally in contact with the pilot by mechanical engagement or bonding by soldering or laser welding or the lake. A method of forming a probe tip on an array of test probes in a support member for a test apparatus includes inserting a plurality of probes into an array of probe cylinders in the member with the ends of the probes extending below the ends of the cylinders, the probes being retained by fixturing means at a predetermined position in the cylinders, the ends of the probes are planarized to provide a smooth surface of the member with the probes flush therewith, apply a layer of resist to the lower surface of the member covering the guide plate and the newly planarized lower ends of the probes, after the resist has been exposed to a pattern through a high precision mask, a set of rings at the base of the planarized probes is formed An the resist by etching the tips through the resist, and then remove the fixturing means.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Spring probes are used to perform electrical tests on substrates, electronic devices and personal computer boards, etc.

Figure 1:
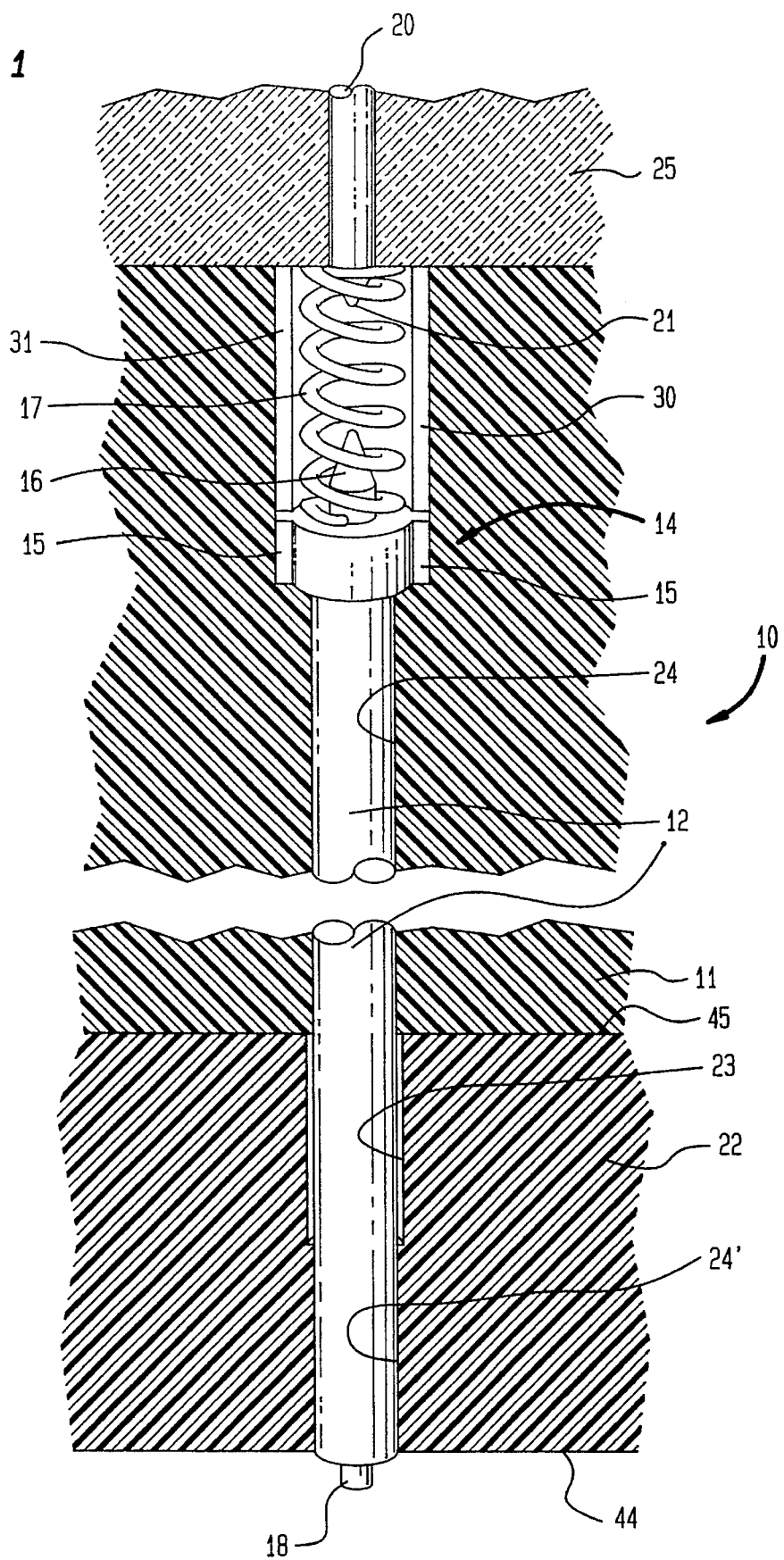
FIG. 1 shows a spring probe apparatus in accordance with this invention.

Spring probe apparatus 10 in accordance with this invention is illustrated in FIG. 1. A probe guide 11 and a guide plate 22 which are secured together have a plurality of matching cylindrical holes 24, 24' therethrough each of which carries a contact probe (pin) 12 for longitudinal reciprocation of probe 12 "up" and "down" therein, based upon the orientation shown. The holes 24, 24' are all parallel and extend from the top of the guide 11 and guide plate 22 to the bottom thereof. For convenience of illustration, only one set of holes 24, 24' and only one probe 12 is shown. Probe 12 includes on its distal end a head 14 with a cylindrical contact. The head 14 can be formed on the end of probe 12 by means of a die or by EDM. Probe 12 slides freely up and down in a hollow cylindrical space 24 drilled in probe guide 11, and space 24' drilled in guide plate 22. Guide 11 and guide plate 22 are composed of a low friction material (providing a good bearing which will allow the probe to slide freely) which is also a dielectric material. Thus, cylindrical contact probes 12 are free to move in guides 11 made of a plastic insulating material such as an acetal homopolymer e.g. oriented TFE fibers dispersed in the acetal resin (Delrin (R)), a polyimide resin (Vespal (R) a registered trademark of E. I. dupont) or other insulators. The cylinder 24' in guide plate 22 has a counterbore 23 on the inboard end of the cylinder to relieve the friction forces on the probe 12.

Contact probes 12 are composed of a suitable conductive material including copper alloys such as:

1. berrylium copper (BeCu),
2. a ductile alloy which can be altered significantly by heat treatment comprising a high palladium content alloy of Ag, Au, Pt, Cu and a little zinc such as Paliney (Registered Trademark of Ney)
3. brass;

or other materials such as:

4. tungsten (W)
5. nickel (Ni).

The probes 12 have formed or etched contact tips 18.

Cone shaped pilots 16 formed on the top of cylindrical contact heads 14 on the distal ends of contact probes 12 fit into the proximal ends of coiled, gold-plated, metallic compression springs 17. The pilots 16 and the springs 17 can be bonded together by means of soldering or laser welding and the like The springs 17 provide the required probing forces when the cylindrical-contact probe tips 18 at the proximal end of probe 12 are lowered against product pads (not shown for convenience of illustration, which are well known to those skilled in the art.) Connections to test equipment (also not shown for the same reason) are made by means of wires 20 (of a space transformer) whose coned tips 21 fit into the distal end of coil springs 17.

Ribs 15 (tabs) on the periphery of head 14 extend longitudinally and project laterally from the heads 14 of probes 12 for preventing the cylindrical contact heads 14 from rotating during testing operations on work pieces contacted by the cylindrical-contact probe tips 18. The ribs 15 cooperate with the slots 30, 31 in the probe guide 11, parallel to the cylindrical hole 24 to prevent rotation of probe 12. To guarantee contact integrity, the coiled springs 17 can be soldered or welded to the cylindrical contacts and/or the space transformer wires.

When a probe assembly containing a plurality of probes 12 is moved downwardly so that the contact probe tips 18 touch product features on a work piece, the coiled springs 17 are compressed thereby providing the required mechanical forces to make acceptable electrical connections and to provide compliance for variations in height of the product features. The fixed conductor wires 20 of the space transformer carry electrical signals to suitable test equipment (not shown) to be analyzed.

In order to eliminate the hole to hole variations caused by state-of-the art of machining techniques, the probe tips 18 are formed by chemical etching using the photolithographic processes employed in state of the art semiconductor device and thin film circuitry manufacturing. In order to maintain the resulting accuracy when employing this process, it is important that the probes 12 do not rotate once the final tip location and configuration has been established. The process for generating the accurate tips are described below with reference to steps 1–7 in FIGS. 2A–2G.

Figure 2A:
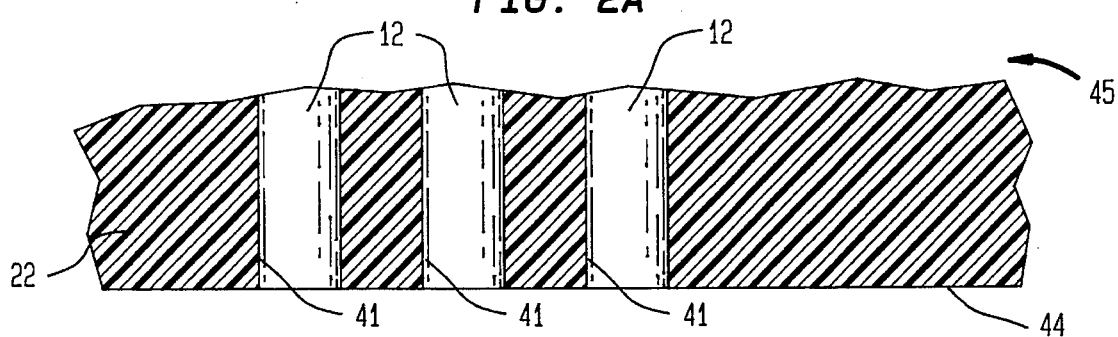
FIGS. 2A–2G show a portion of the apparatus of FIG. 1 and a method for producing probes with tips suitable for use in connection with the apparatus of FIG. 1.

FIG. 2A shows the lower portion of guide plate 22 of FIG. 1 cut away for convenience of illustration. Guide plate 22 has a lower surface 44 and an upper surface 45. in array of holes 41 (cylinders) is drilled or etched through guide plate 22 from the top surface 45 to the lower surface 44. The holes 41 (in the array of cylindrical holes) are aligned with their longitudinal axes in parallel with each other.

Figure 2B:
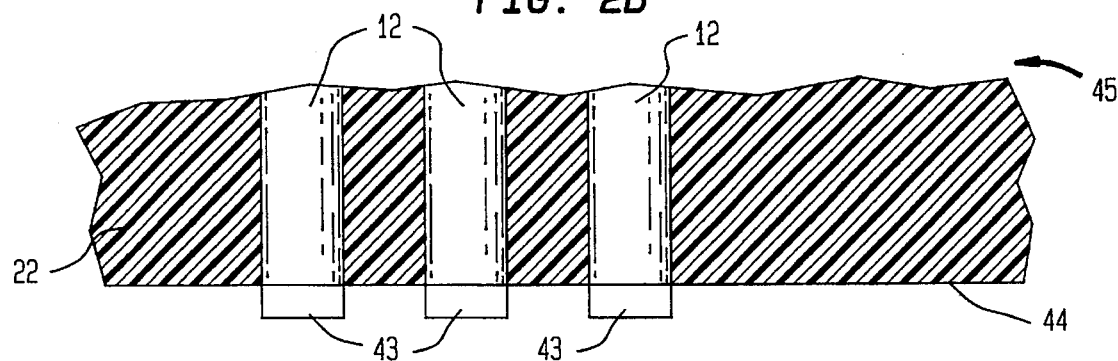

Then, as shown in FIG. 2B, probes 12 (also known in the art as contact pins or beams) of an insulating material as described in connection with FIG. 1, above, are inserted through the top end 45 of guide plate 22 into the cylindrical holes 41. The probes 12 are also long enough so that their ends 43 extend below the bottoms of the holes 41.

In addition, fixturing means is provided to hold the probes 12 in the desired position. For example, a preferred embodiment, the guide plate 22 and the probe guide 11 are spaced apart by a small distance with a shim (not shown for convenience of illustration) to provide a distance by which the probes will extend beyond the guide plate 22. The shim is inserted from the side between the plate 22 and the guide 11 providing uniform spacing therebetween.

Figure 2C:
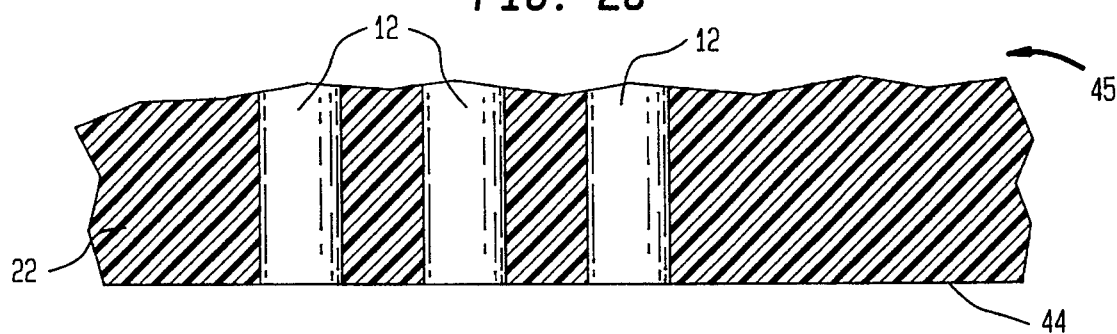

In FIG. 2C, the ends 43 of probes 12 are planarized away to provide a smooth surface of guide plate 22 with the probes 12 flush therewith.

Figure 2D:
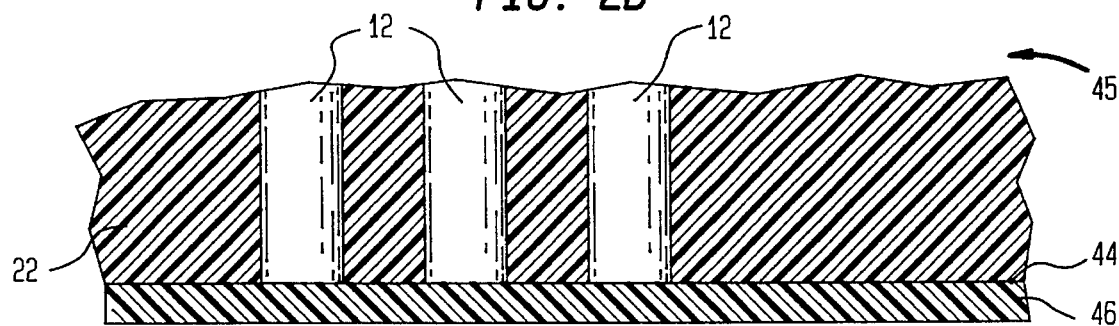

In FIG. 2D, a layer of resist 46 is applied to the lower surface 44 of guide plate 22, covering the guide plate 22 and the newly planarized lower ends of probes 12.

Figure 2E:
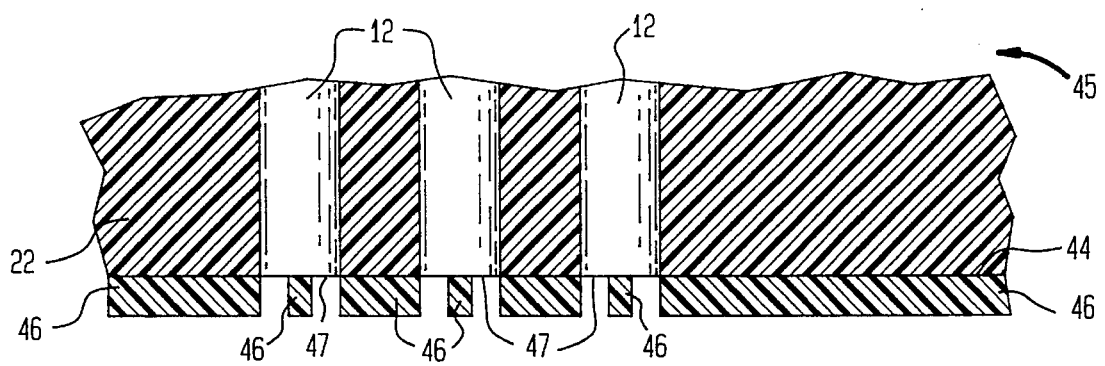

In FIG. 2E, after the resist 46 has been exposed to a pattern through a high precision mask (as is well known to those skilled in the art of photolithography), a set of rings 47 at the base of the planarized probes 12 is formed in the resist 46.

Figure 2F:
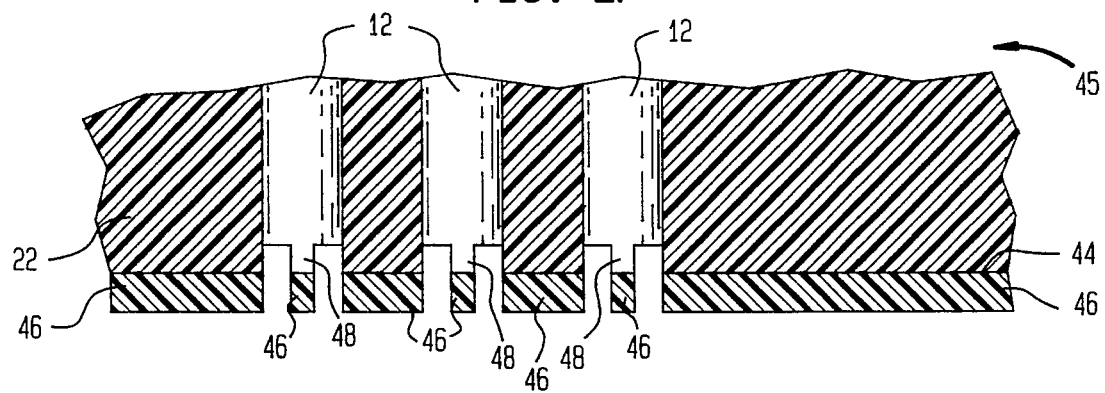

In FIG. 2F, probe tips 48 on the ends of probes 12 have been etched through the rings 47 in resist 46.

Next, the fixturing means such as the shim between the guide plate 22 and the probe guide 11 is removed to permit the probe tips 48 to extend below the bottom surface 44 of guide plate 22.

Figure 2G:
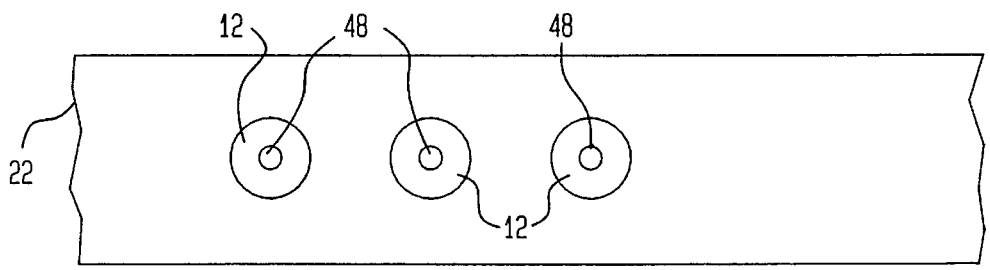

FIG. 2G shows the bottom view (base) of guide plate 22 with the tips 48 in the center of the ends of probes 12.

The assembly is now ready for testing and all of the probes extend below the guide plate by a uniform distance which improves the uniformity of the testing apparatus.

Industrial Applicability

Such probes can be used to replace buckling beam probes. Spring probes in accordance with this invention offer the advantages of ease and economy of manufacture, resistance to damage, and ease of maintenance.

While this invention has been described in terms of the above embodiment(s), those skilled in the art will recognize that the invention can be practiced with modifications within the spirit and scope of the appended claims.

What is claimed is:

1. A method of manufacture of a test apparatus, said test apparatus including a support member with an array of probe cylinders and a corresponding array of test probes, said support member having a surface and containing said array of probe cylinders each of which extends to said surface and each of said probe cylinder having an end at said surface, said array of test probes each having an end, said array of test probes being located in said probe cylinders, said test apparatus being made by a series of steps in the sequence as follows:

inserting each said test probe of said plurality of probes into a corresponding cylinder in said array of probe cylinders in said member with the end of each said probe having its end extending below said end of said cylinder in a fully extended position, each of said probes located within said cylinders having a proximal end and a distal end with the testing tip of each of said probes being located on said proximal end, locating an electrically conductive compression spring within each of said cylinders, with the proximal end thereof secured to said distal end of said test probes, providing said probes with an enlarged head at the distal end thereof with at least one longitudinal rib projecting from the periphery of said head, providing said hollow cylinders with at least one longitudinal slot mating with said rib on said head so said probes are reciprocable within said hollow cylinders and said rib is simultaneously reciprocable with each of said probes in said slot moving said member into a retraction position in which said probes are partially retracted within said cylinders with said ends of each of said probes extending beyond said surface by a smaller distance than in said fully extended position, the ends of each of said probes being planarized to provide a smooth surface of said member with said probes comprising planarized probes flush with said surface of said member, applying a layer of resist to cover said surface of said member and said planarized ends of each of said probes, exposing said resist to a pattern through a high precision mask with a ring formed in said resist centered upon the lower end of each of said probes, forming a ring at said lower end of each of said planarized probes in said resist after forming said ring in said resist by etching said end through said ring in said resist to form a tip thereon, and then releasing said member from said retraction position.

2. A method in accordance with claim 1 comprising said probes located within said cylinders having a proximal end and a distal end with the testing tip of said probes being located on said proximal end, locating an electrically conductive compression spring within each of said cylinders, with the proximal end thereof secured to the distal end of said test probes, providing said probes with an enlarged head at the distal end thereof with at least one longitudinal rib projecting from the periphery of said head, providing said hollow cylinders with at least one longitudinal slot mating with said rib on said head so said probes are reciprocable within said hollow cylinders and said rib is simultaneously reciprocable with each of said probes in said slot.

3. A method in accordance with claim 2 wherein said probes include probe tips formed by chemical etching using the photolithographic processes.

4. A method in accordance with claim 2 wherein said probes are formed as cylindrical contact probes free to move in guides made of a plastic insulating material.

5. A method in accordance with claim 4 wherein said plastic insulating material comprises an acetal homopolymer including oriented TFE fibers dispersed in an acetal or a polyimide resin.

6. A method in accordance with claim 4 including cone shaped pilots formed on the top of cylindrical contact heads on said distal ends of said contact probes fit into the proximal ends of coiled, gold-plated, metallic compression springs.

7. A method of manufacture of a test apparatus, said test apparatus including a support member with an array of probe cylinders and a corresponding array of test probes, said support member having a surface and containing said array of probe cylinders each of which extends to said surface and each of said probe cylinder having an end at said surface, said array of test probes each having an end, said array of test probes being located in said probe cylinders, each said test probes of said plurality of probes located in a corresponding cylinder in said array of probe cylinders in said member with the end of each said probe having its end extending below said end of said cylinder in a fully extended position, each of said probes located within said cylinders having a proximal end and a distal end with the testing tip of each of said probes being located on said proximal end, cone shaped pilots formed on the top of cylindrical contact heads on said distal ends of said contact probes fit into the proximal ends of coiled, gold-plated, metallic compression springs, said pilots and said springs are bonded together, by a means selected from the group consisting of soldering and laser welding, said probes are formed as cylindrical contact probes free to move in guides made of a plastic insulating material comprising an acetal homopolymer including oriented TFE fibers dispersed in an acetal or a polyimide resin, said test apparatus being made by a series of steps in the sequence as follows:

moving said member into a retraction position in which said probes are partially retracted within said cylinders with said ends of each of said probes extending beyond said surface by a smaller distance than in said fully extended position, the ends of each of said probes being planarized to provide a smooth surface of said member with said probes comprising planarized probes flush with said surface of said member, applying a layer of photolithographic resist to cover said surface of said member and said planarized ends of each of said probes, exposing said resist to a pattern through a high precision mask with a ring formed in said resist centered upon the lower end of each of said probes, forming a ring at said lower end of each of said planarized probes in said resist after forming said ring in said resist by chemical etching of said end through said ring in said resist to form a tip thereon, and then releasing said member from said retraction position.

8. A method in accordance with claim 7 wherein said probes are composed of brass, beryllium copper (BeCu), tungsten (W) or nickel (Ni).

* * * * *